(12) United States Patent
Yang et al.

(10) Patent No.: US 8,911,846 B2
(45) Date of Patent: Dec. 16, 2014

(54) BLOCK COPOLYMER ASSEMBLY

(71) Applicant: Seagate Technology, LCC, Cupertino, CA (US)

(72) Inventors: XiaoMin Yang, Livermore, CA (US); Kim Yang Lee, Fremont, CA (US); HongYing Wang, Fremont, CA (US)

(73) Assignee: Seagate Technology LLC, Cupertino, CA (US)

( * ) Notice: Subject to any disclaimer, the term of this patent is extended or adjusted under 35 U.S.C. 154(b) by 176 days.

(21) Appl. No.: 13/645,783

(22) Filed: Oct. 5, 2012

(65) Prior Publication Data

US 2014/0099478 A1 Apr. 10, 2014

(51) Int. Cl.

| | |
|---|---|
| *B32B 3/02* | (2006.01) |
| *C04B 41/52* | (2006.01) |
| *C04B 41/00* | (2006.01) |
| *G11B 5/73* | (2006.01) |
| *G11B 7/24* | (2013.01) |
| *H01F 10/24* | (2006.01) |
| *G11B 7/26* | (2006.01) |
| *B32B 27/08* | (2006.01) |
| *C04B 41/89* | (2006.01) |
| *H05K 1/03* | (2006.01) |

(52) U.S. Cl.
CPC .............. *B32B 27/08* (2013.01); *C04B 41/524* (2013.01); *C04B 41/009* (2013.01); *G11B 5/7315* (2013.01); *C04B 41/52* (2013.01); *G11B 7/24* (2013.01); *H01F 10/245* (2013.01); *G11B 7/26* (2013.01); *C04B 41/89* (2013.01); *H05K 1/0333* (2013.01); *C04B 41/522* (2013.01)
USPC ....... 428/64.2; 428/800; 428/195.1; 428/210; 428/446

(58) Field of Classification Search
CPC ........ B32B 27/08; G11B 5/7315; G11B 7/24; G11B 7/26; H05K 1/0333; H01F 10/245; C08B 41/009; C08B 41/52; C08B 41/522; C08B 41/524; C08B 41/89
USPC ...................... 428/64.2, 800, 195.1, 210, 446
See application file for complete search history.

(56) References Cited

U.S. PATENT DOCUMENTS

| | | |
|---|---|---|
| 8,475,669 B2 | 7/2013 | Albrecht et al. |
| 2010/0124638 A1* | 5/2010 | Xiao et al. ................. 428/195.1 |
| 2012/0107583 A1* | 5/2012 | Xiao et al. ..................... 428/210 |
| 2012/0196094 A1* | 8/2012 | Xu et al. .................... 428/195.1 |
| 2014/0099478 A1* | 4/2014 | Yang et al. .................... 428/172 |

* cited by examiner

*Primary Examiner* — Betelhem Shewareged (57) ABSTRACT

The embodiments disclose a block copolymer assembly structure, including a first pattern and second pattern with a first density of patterned features integrated in data and servo zones, a silicon substrate with thin film layers deposited thereon and patterned using the first density of first pattern and second pattern features and a template fabrication pattern with a second density greater than the first density created using ordered block copolymer periodic structures across a portion of the substrate.

20 Claims, 13 Drawing Sheets

BLOCK COPOLYMER ASSEMBLY

BACKGROUND

Templates including those using block copolymer (BCP) materials generally rely on multiple overlays to create various sections in for example bit patterned media (BPM) template fabrication. One overlay is used to create data zones with magnetic dots and another overlay to create servo zones with trenches in which magnetic dots are created. The use of multiple overlays includes more processing time and frequent quality issues due to misalignments and mismatched layer thicknesses.

DETAILED DESCRIPTION OF THE INVENTION

In a following description, reference is made to the accompanying drawings, which create a part hereof, and in which is shown by way of illustration a specific example in which the invention may be practiced. It is to be understood that other embodiments may be utilized and structural changes may be made without departing from the scope of the present invention.

General Overview:

It should be noted that the descriptions that follow, for example, in terms of a block copolymer assembly is described for illustrative purposes and the underlying system may apply to any number and multiple types of block copolymers and first pattern and second pattern features. In one embodiment the block copolymer assembly includes using sphere-forming and cylinder-forming block copolymers. The first pattern and second pattern patterns may include stack templates including servo-integrated bit patterned media and may include using first pattern and second pattern dots and/or lines patterning for uses including semiconductor and/or photonic devices using the present invention.

Figure 1:
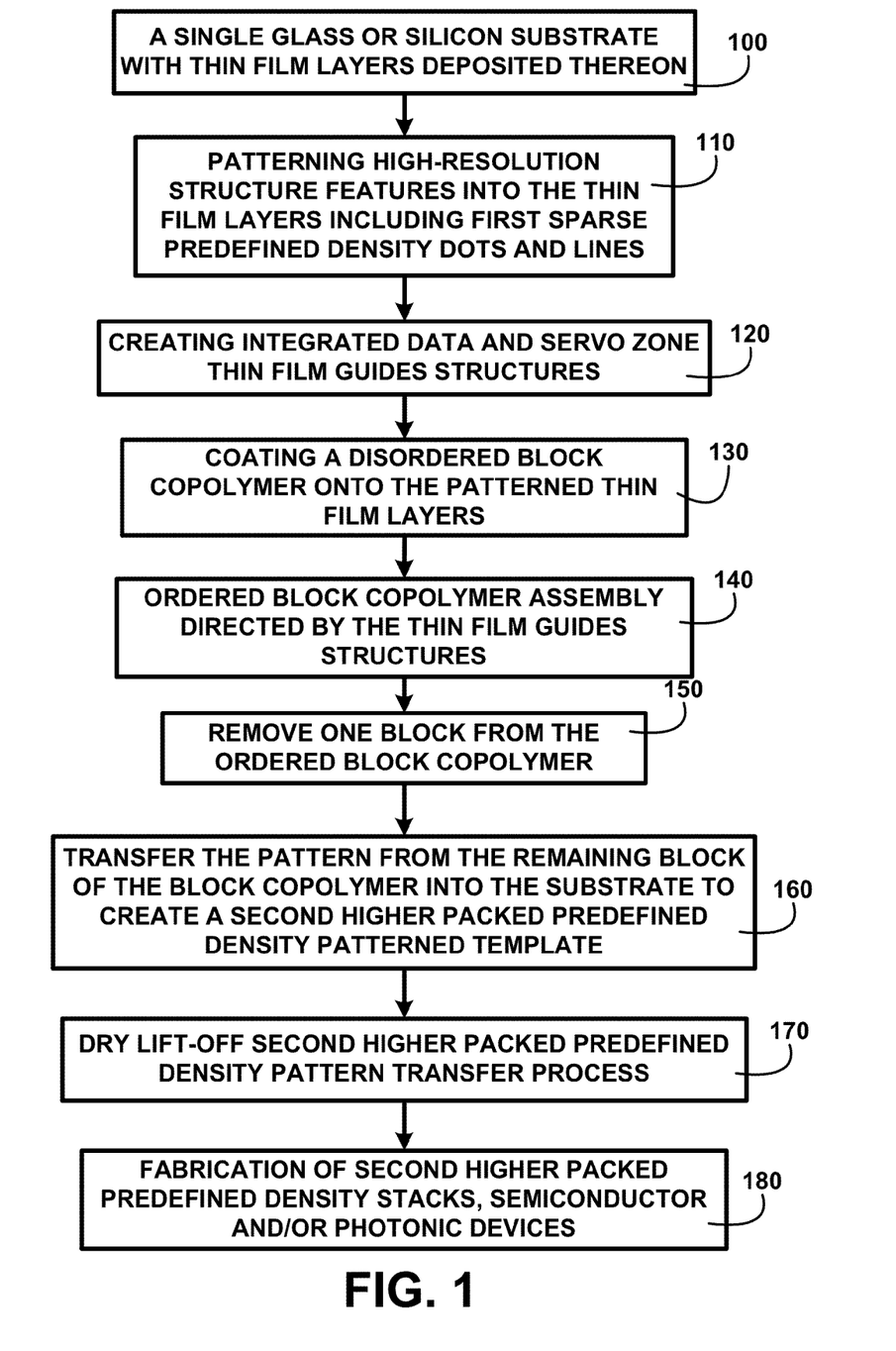
FIG. 1 shows a block diagram of an overview of a block copolymer assembly of one embodiment.

FIG. 1 shows a block diagram of an overview of a block copolymer assembly of one embodiment. FIG. 1 shows a block copolymer assembly template fabrication pattern 100. A block copolymer assembly template fabrication pattern 100 is created from a first pattern and second pattern with a first density of patterned features integrated in data and servo zones 110. The first pattern includes first density multi-dimensional features including 2-dimensional thin film dots including an areal density of 255 Giga dots per square inch (Gdpsi). The second pattern includes one-dimensional features including one-dimensional thin film lines of one embodiment.

A silicon substrate with thin film layers deposited thereon and patterned using the first density of first pattern and second pattern features 120. The substrate includes materials including silicon or glass. A disordered block copolymer coating on the patterned thin film layers 130 is assembled into an ordered block copolymer assembly of periodic structures directed by the transferred first and second patterned features simultaneously in the data and servo zones 140. The ordered block copolymer assembly of periodic structures occurs simultaneously in the data and servo zones reducing processing time and preventing overlay alignment errors of one embodiment.

A fabrication pattern with a second density greater than the first density is revealed with one block from the ordered block copolymer removed 150. A template fabrication pattern of ordered block copolymer periodic structures across a portion of the substrate with a second density greater than the first density 160 is etched down to the entire substrate material including silicon or glass and across the entire substrate below the thin film layers to create a template.

In one embodiment the second pattern of features for example lines are used to define the divisional boundaries between the data and servo zones and the servo zone section formations in which the servo instructions and set data information are embedded. The creation of the divisional boundaries between the zones and the servo zone section formations directs the block copolymer assembly to only those surface areas intended for the assembly process to occur.

Processes are used to transfer the fabrication pattern from the remaining block of the ordered block copolymer into the substrate to create a fabrication pattern second density patterned template. The fabrication pattern second density patterned template is used in fabrication of second density stacks, semiconductor and/or photonic devices. The block copolymer assembly uses a dry lift-off fabrication pattern second density template pattern transfer process for the fabrication of second density stacks, semiconductor and/or photonic devices including a bit patterned media (BPM).

Generally the ordered block copolymer assembly processes in the data zone and the servo zone are two separate processes. The block copolymer patterns for each of the data zone and the servo zone differ in surface area processed. The data zone is a full field pattern. The servo zone pattern is not full field coverage and includes sections created to provide instructions and set data information. The block copolymer assembly has advantages by creating a uniform layer thickness across the surfaces of the substrate and reducing processing time and misalignments by eliminating the use of multiple overlays for creation of separate data and servo zones of one embodiment.

The simultaneous block copolymer assembly enables a fast, simplified and accurate fabrication method to create second density fabrication pattern templates. The second density fabrication pattern templates are used in a dry lift-off second density pattern transfer process. The dry lift-off transfer process using the second density fabrication pattern templates achieves a clean high quality transfer during fabrication of second density stacks, semiconductor and/or photonic devices of one embodiment.

Figure 2A:
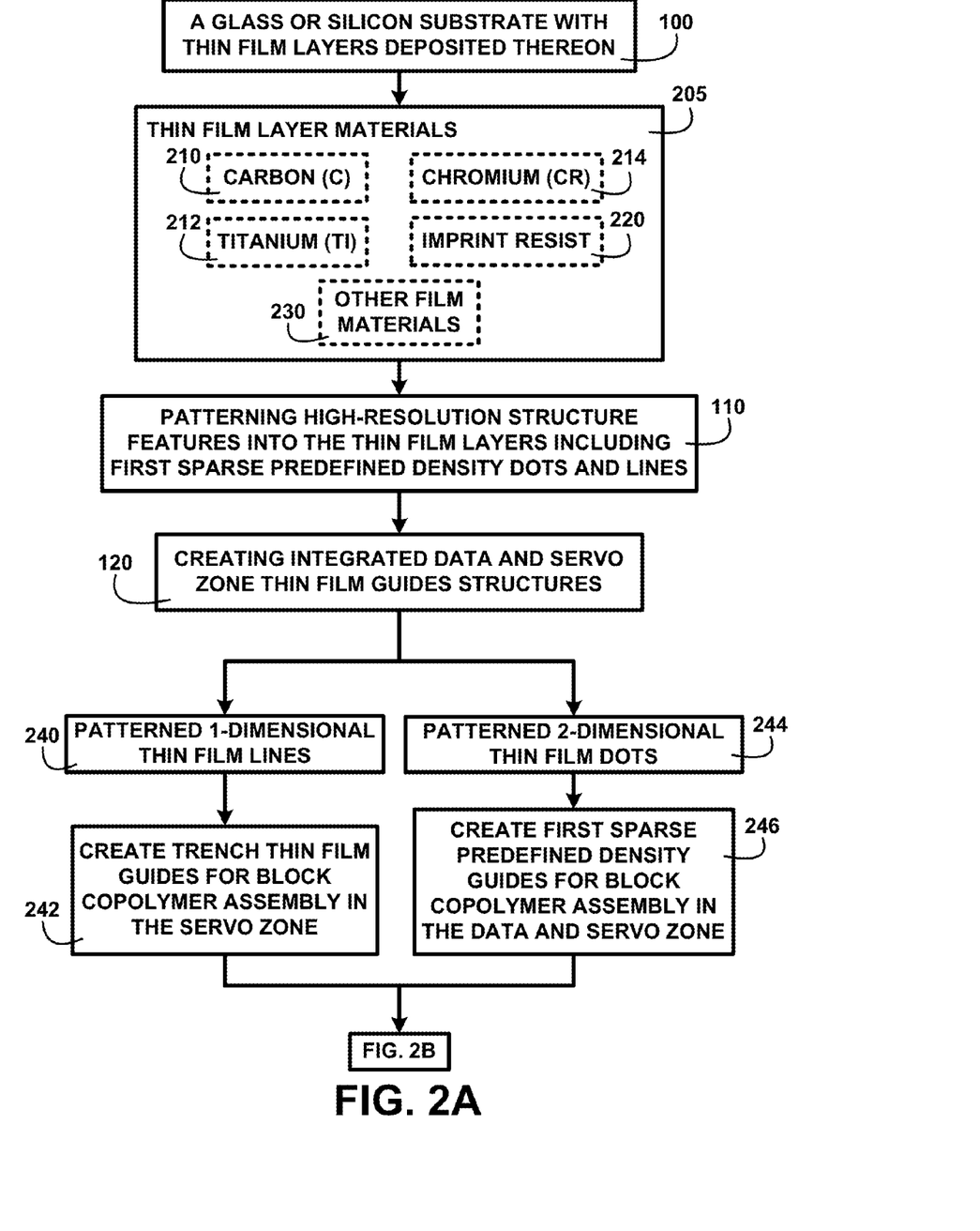
FIG. 2A shows a block diagram of an overview flow chart of a block copolymer assembly of one embodiment.

Detailed Description:

FIG. 2A shows a block diagram of an overview flow chart of a block copolymer assembly of one embodiment. FIG. 2A shows a glass or silicon substrate with thin film layers deposited thereon 200. The thin film layer materials 202 is a deposition of material for example carbon (C) 204, titanium (Ti) 206, chromium (Cr) 208, imprint resist 210 and other film materials 212. The layer of thin film layer materials 202 is used to create first pattern and second pattern dots and lines patterning of one embodiment.

Patterning first pattern multi-dimensional and second pattern one-dimensional features into the thin film layers includes first density dots and lines 220. The first pattern and second pattern dots and lines patterning are used in creating integrated data and servo zone thin film guiding structures 225. Second patterned 1-dimensional thin film lines 240 are used to create trench thin film guides for ordered block copolymer assembly in the servo zone 242. First patterned 2-dimensional thin film dots 244 are used to create first density guides for ordered block copolymer assembly in the data and servo zone 246. The uses of the patterned thin film guides are further described in FIG. 2B of one embodiment.

Figure 2B:
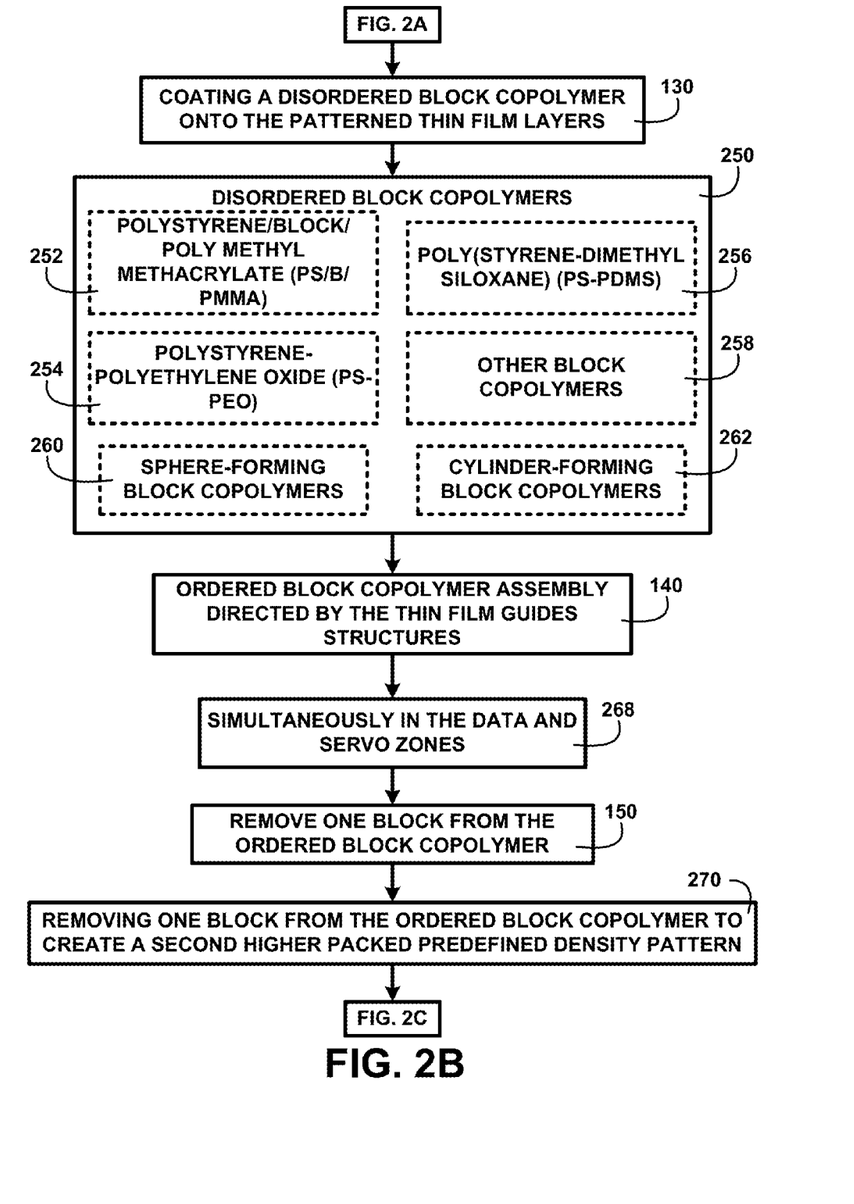
FIG. 2B shows a block diagram of an overview flow chart of a directed ordered block copolymer assembly of one embodiment.

Ordered Block Copolymer Assembly:

FIG. 2B shows a block diagram of an overview flow chart of a directed ordered block copolymer assembly of one embodiment. FIG. 2B shows one embodiment of the block copolymer assembly continued from FIG. 2A using the patterned thin film guides. The patterned thin film guides are used to direct block copolymer (BCP) assembly. Block copolymer assembly begins with coating a disordered block copolymer onto the patterned thin film layers 248. Disordered block copolymers 250 include poly(styrene-block-methyl methacrylate) P(S-b-MMA) 252, polystyrene-polyethylene oxide (PS-PEO) 254, poly(styrene-dimethyl siloxane) (PS-PDMS) 256, other block copolymers 258, sphere-forming block copolymers 260 and cylinder-forming block copolymers 262 of one embodiment.

Figure 2C:
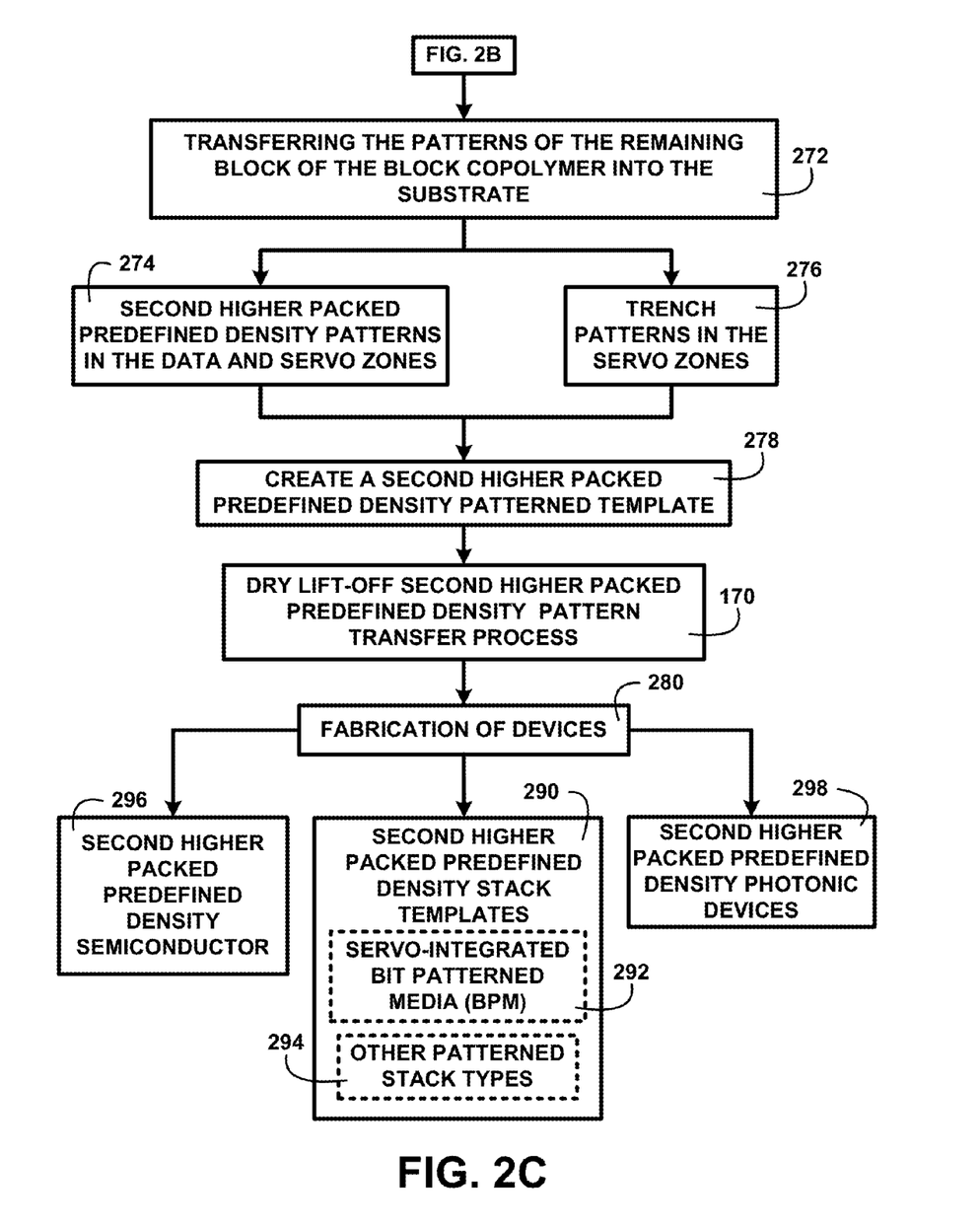
FIG. 2C shows a block diagram of an overview flow chart of a fabrication pattern template fabrication of a block copolymer assembly of one embodiment.

Ordered block copolymer assembly of second density periodic structures 264 is directed simultaneously in the data and servo zones by the thin film guiding structures 268. A process is used to remove one block from the ordered block copolymer 270 to create a second density fabrication pattern 272. FIG. 2C describes the continuation of processes in of one embodiment.

Fabrication Pattern Template:

FIG. 2C shows a block diagram of an overview flow chart of a fabrication pattern template fabrication of a block copolymer assembly of one embodiment. FIG. 2C shows transferring the fabrication patterns of the remaining block of the block copolymer into the substrate 273. The fabrication patterns include second density patterns in the data and servo zones 274. The second patterned 1-dimensional thin film lines 240 of FIG. 2A are used to create trench patterns in the servo zones 276. The transfer of fabrication patterns into the substrate is used to create a second density fabrication patterned template 278 of one embodiment.

A dry lift-off second density fabrication pattern transfer process 280 is used in fabrication of devices 282. The fabrication of devices 282 includes second density stack templates 290 including servo-integrated bit patterned media (BPM) 292 and other patterned stack types 294. The dry lift-off second density fabrication pattern transfer process 280 is used in fabrication of devices 282 including second density semiconductor 296 and second density photonic devices 298 of one embodiment.

The directed first density ordered block copolymer assembly reduces the time used in the fabrication of second density fabrication pattern templates using the of processing as BCP direct self-assembly (DSA) occurs at the same time in the areas of the patterned thin film guides.

Processes using the patterned thin film guides including the second patterned 1-dimensional thin film lines 240 of FIG. 2A and first patterned 2-dimensional thin film dots 244 of FIG. 2A reduce the time of processing as BCP direct self-assembly (DSA) occurs at the same time in the areas of the patterned thin film guides. The reduction of processing time and integrated BCP DSA in the fabrication of second density fabrication pattern templates optimizes quality of the pattern transfers by using a dry lift-off second density fabrication pattern transfer process 280. The dry lift-off second density fabrication pattern transfer process 280 includes using processes including oxygen plasma and ion etching for example to remove the patterned thin film guides. The block copolymer assembly saves processing time and optimizes quality in fabrication of second density stacks, semiconductor and/or photonic devices 180 of one embodiment.

Figure 3A:
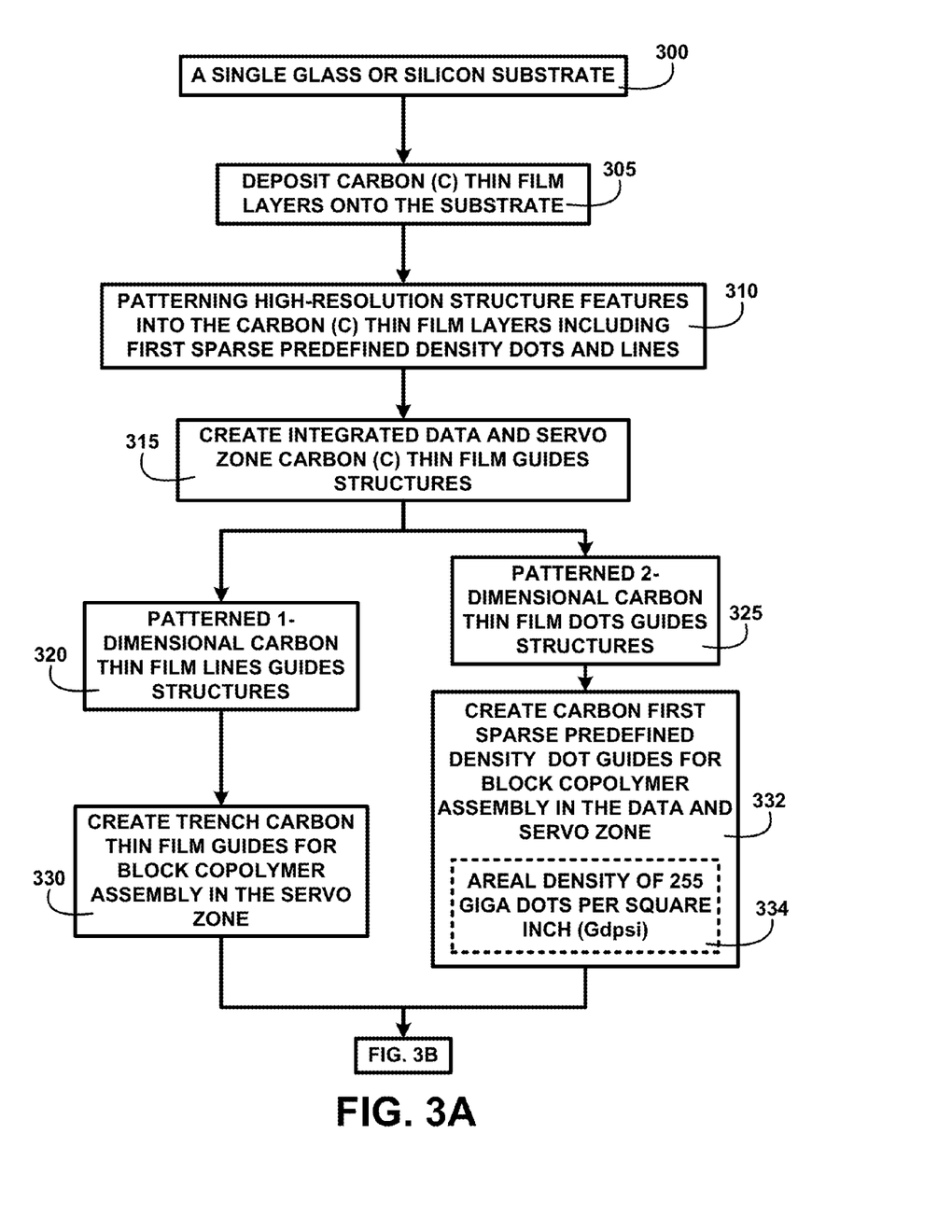
FIG. 3A shows a block diagram of an overview flow chart of bit patterned media carbon thin film guides of one embodiment.
Figure 3B:
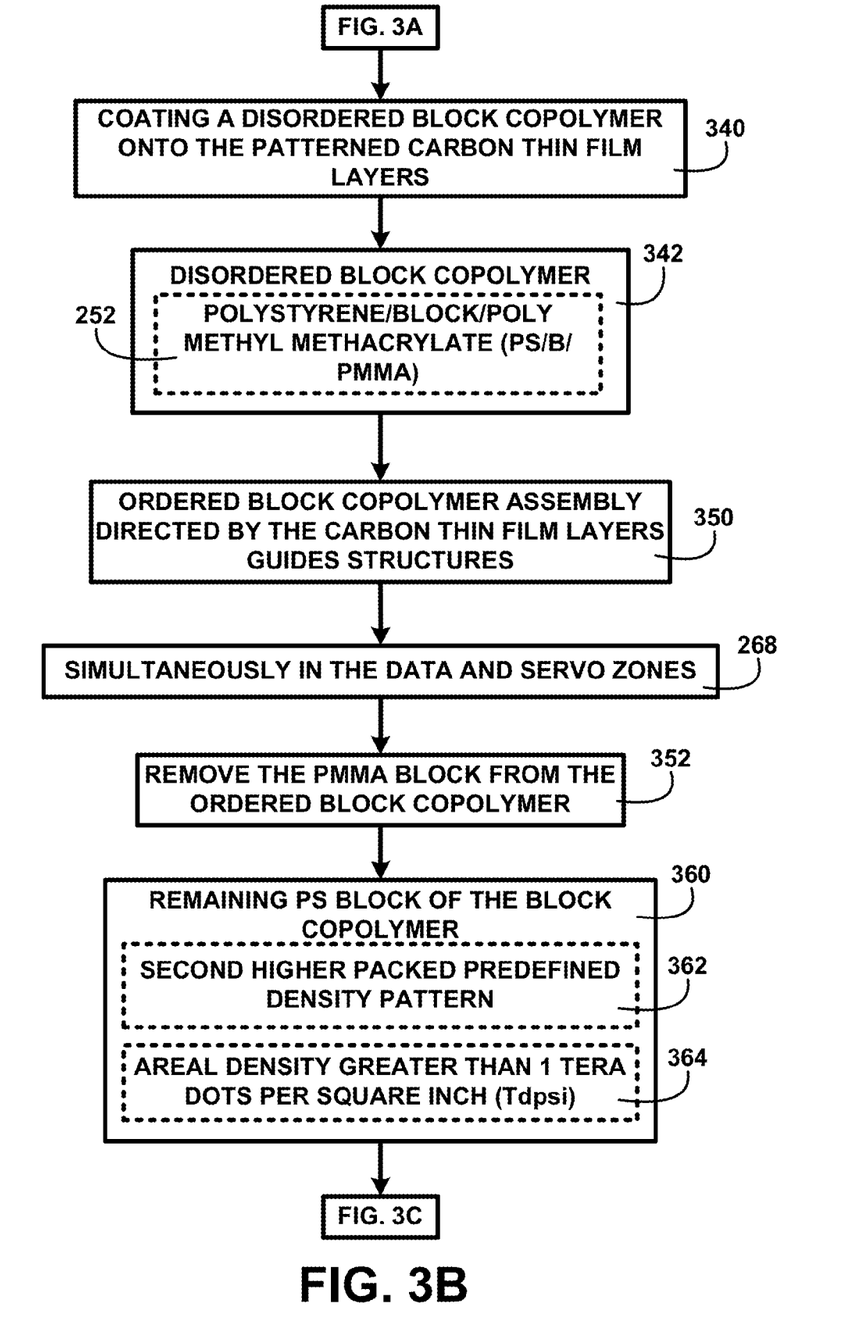
FIG. 3B shows a block diagram of an overview flow chart of bit patterned media carbon thin film guided block copolymer direct self-assembly of one embodiment.
Figure 3C:
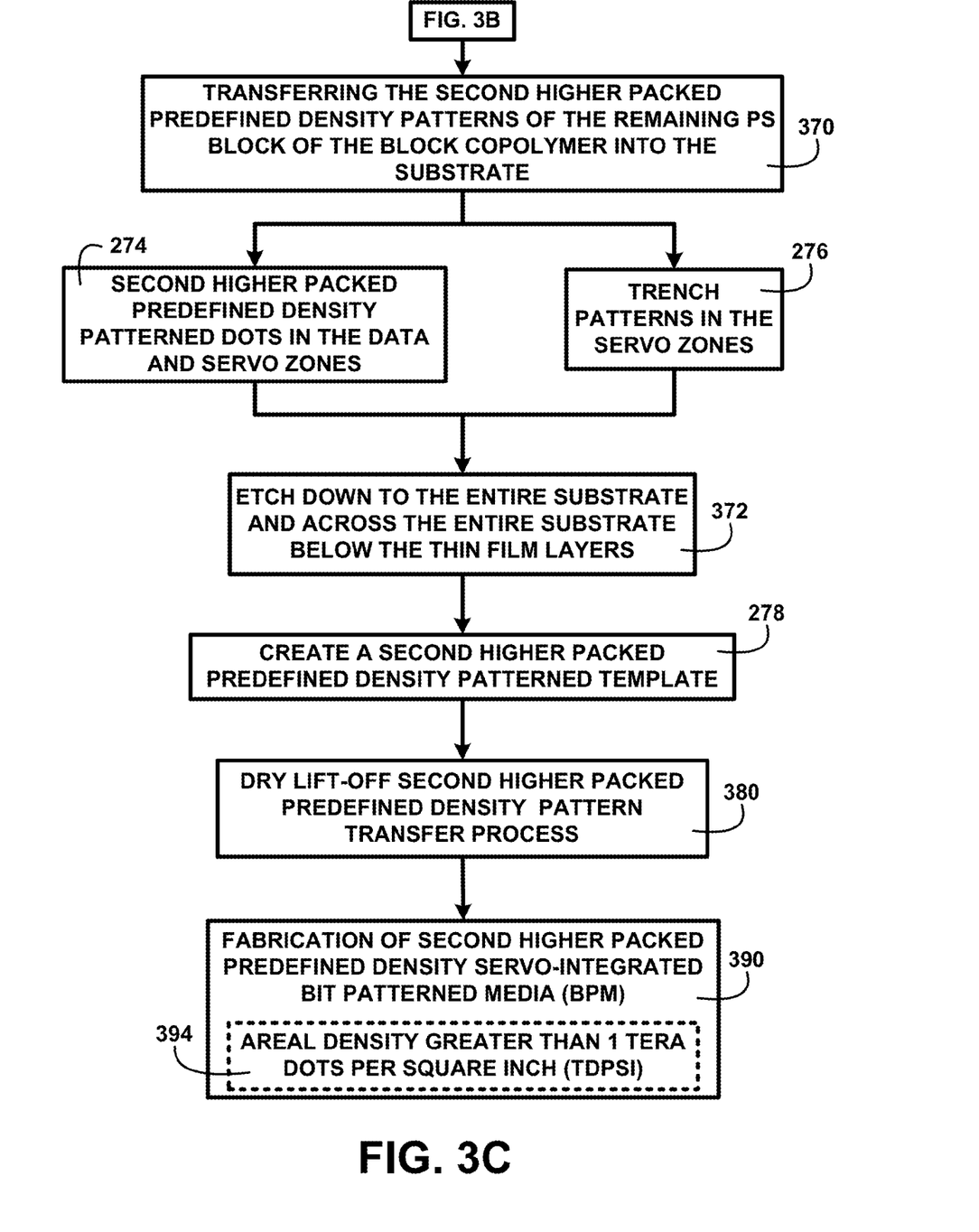
FIG. 3C shows a block diagram of an overview flow chart of bit patterned media carbon thin film fabrication pattern template fabrication of one embodiment.

High Areal Density Stack Templates:

FIG. 3A, FIG. 3B and FIG. 3C describe one embodiment of the block copolymer assembly configured to use patterned carbon thin films to direct block copolymer self-assembly for use in the fabrication of high areal density stack templates including servo-integrated bit patterned media.

BPM Carbon Thin Film Guides:

FIG. 3A shows a block diagram of an overview flow chart of bit patterned media carbon thin film guides of one embodiment. FIG. 3A shows a glass or silicon substrate 300. A process is used to deposit carbon (c) thin film layers onto the substrate 305. Patterning first pattern 2-dimensional first density dot and second pattern 1-dimensional line features into the carbon (c) thin film layers 310 is used to create integrated data and servo zone carbon (c) thin film guiding structures 315. Patterned 1-dimensional carbon thin film lines guiding structures 320 create trench carbon thin film guides for ordered block copolymer assembly in the servo zone 330. Patterned 2-dimensional carbon thin film dots guiding structures 325 create carbon first density dot guides for ordered block copolymer assembly in the data and servo zone 332. The patterned 2-dimensional carbon thin film dots guiding structures 325 have a first density including an areal density of 255 Giga dots per square inch (Gdpsi) 334. The descriptions processes continue in FIG. 3B of one embodiment.

BPM Carbon Thin Film Guided BCP DSA:

FIG. 3B shows a block diagram of an overview flow chart of bit patterned media carbon thin film guided block copolymer direct self-assembly of one embodiment. FIG. 3B shows a continuation from FIG. 3A in which coating a disordered block copolymer onto the patterned carbon thin film layers 340 begins a block copolymer directed assembly. The coating is of a disordered block copolymer 342 including polystyrene/block/poly methyl methacrylate (PS/b/PMMA) 252. An ordered block copolymer assembly of periodic structures directed by the integrated carbon thin film layers guiding structures 350 is done simultaneously in the data and servo zones 351 defined by the first pattern and second pattern patterning of dots and lines. The integrated carbon thin film layers guiding structures direct the phase separation of a disordered coating of block copolymer to create a second density of PS block periodic structures.

A process is used to remove the PMMA block from the ordered block copolymer 352. Remaining PS block periodic structures of the ordered block copolymer 360 create a second density fabrication pattern 362. The second density fabrication pattern includes a BPM pattern with an areal density greater than 1 Tera dots per square inch (Tdpsi) 364. Descriptions of continuing processes are shown in FIG. 3C of one embodiment.

BPM Fabrication Pattern:

FIG. 3C shows a block diagram of an overview flow chart of bit patterned media carbon thin film fabrication pattern template fabrication of one embodiment.

FIG. 3C shows processes transferring the second density fabrication patterns into the substrate 370. The second density fabrication patterns include second density patterned dots in the data and servo zones 371 and trench patterns in the servo zones 276. The transfer of the second density fabrication patterns includes an etch down to the entire substrate and across the entire substrate below the thin film layers 372. The substrate etching is used to create a second density fabrication patterned template 278. A dry lift-off second density fabrication pattern transfer process 380 is used for fabrication of second density servo-integrated bit patterned media (BPM) 390 having an areal density greater than 1 Tera dots per square inch (Tdpsi) 394 of one embodiment.

Water Contact Angles:

The shape of a liquid droplet, including a water droplet, at rest in contact with a flat, solid surface is characteristically lenticular. The angle created by the solid surface and the tangent line to the upper surface of the water droplet at the end point is called the contact angle. The contact angle is a result of the interface/surface tensions (surface free energies) between liquid and solid surrounded by vapor, and is measured to determine the water contact angle. A water droplet will spread on a hydrophilic surface. The evaluation of hydrophilicity is made through water contact angle measurements. The water contact angle on a hydrophilic surface will be significantly low. A hydrophobic surface repels a mass of water and the shape of a water droplet on a hydrophobic surface would be spherical and retard spreading. The evaluation of hydrophobicity is made through water contact angle measurements. The water contact angle on a hydrophobic surface will be significantly high of one embodiment.

It should be noted that the descriptions that follow, for example, in terms of a water contact angle, angles less than 90 degrees (90°) are acute. In the following description an acute water contact angle is also referred to as a low water contact angle. Water contact angles equal to and/or greater than 90 degrees (90°) are right and/or obtuse angles. In the following descriptions a right and obtuse water contact angle is also referred to as a high water contact angle of one embodiment.

Figure 4A:
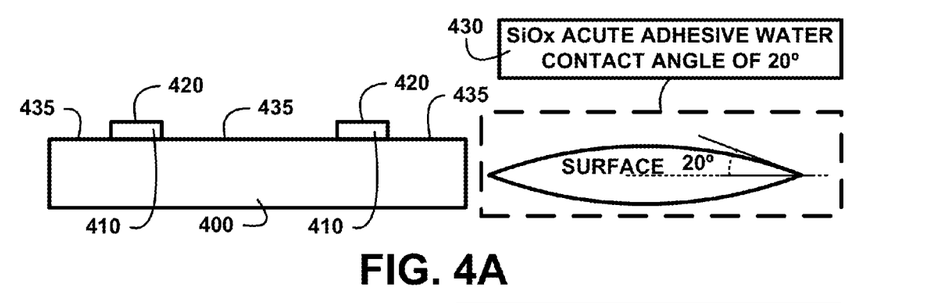
FIG. 4A shows for illustrative purposes only an example of patterned carbon dots of one embodiment.
Figure 4B:
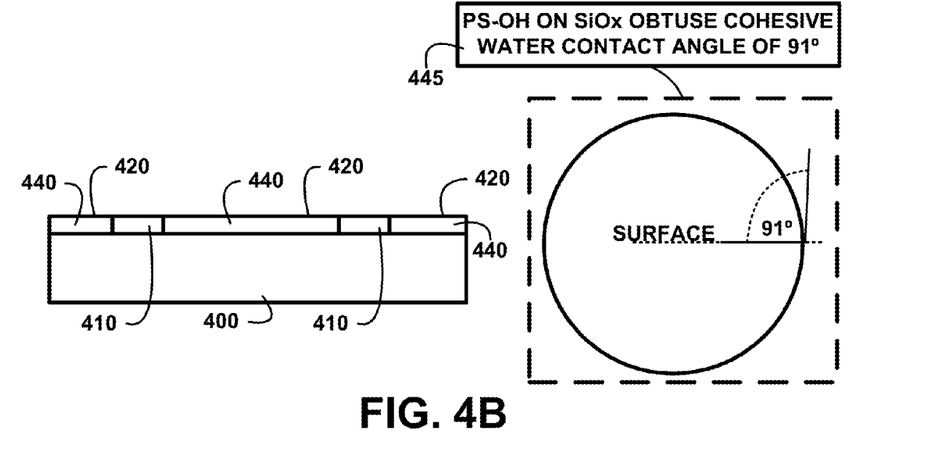
FIG. 4B shows for illustrative purposes only an example of a hydroxy terminated polystyrene self-assembled monolayer of one embodiment.
Figure 4C:
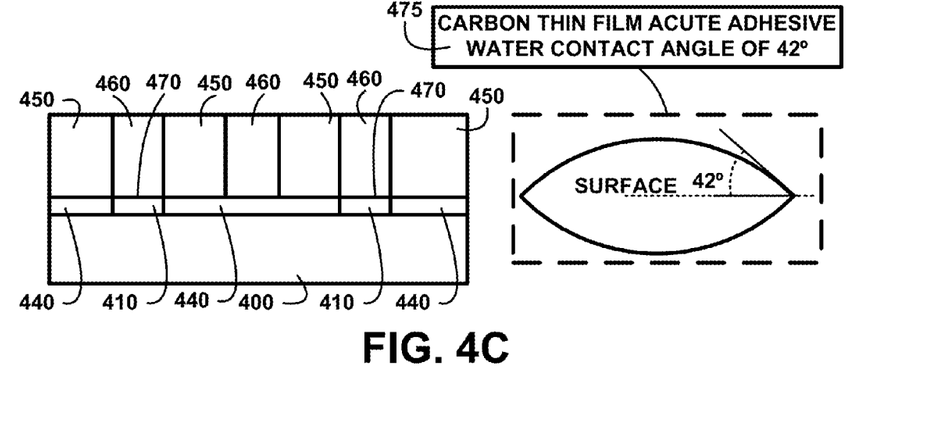
FIG. 4C shows for illustrative purposes only an example of a PMMA block pinning using carbon thin film dots of one embodiment.

FIG. 4A, FIG. 4B and FIG. 4C demonstrate a block copolymer (BCP) direct self-assembly (DSA) using patterned carbon thin film guides. The patterned carbon thin film guides shown are illustrated as patterned 2-dimensional carbon thin film dots guiding structures patterned 2-dimensional carbon thin film dots guiding structures 325 of FIG. 3A. The water contact angle of the surfaces of the thin film layer materials 202 of FIG. 2A are used to guide the distribution of liquid depositions of layered materials used in the block copolymer assembly processes of one embodiment.

A hydrophilic surface forms a low water contact angle. The hydrophilic surface with the low water contact angle has a higher surface energy creating a lower surface tension which leads to a faster interfacial flow rate of a deposited liquid. A hydrophobic surface forms a high water contact angle. The hydrophobic surface with the higher water contact angle has a lower surface energy creating a lower surface tension which leads to a slower interfacial flow rate of a deposited liquid. The first pattern and second pattern dots and/or lines patterning created using the thin film layer materials 202 of FIG. 2A direct the distribution of the types of (BCP) block copolymers materials 260 during the direct self-assembly (DSA) of one embodiment.

Patterned Carbon (C) Dots:

FIG. 4A shows for illustrative purposes only an example of patterned carbon dots of one embodiment. FIG. 4A shows a pre-pattern method of BCP DSA using patterning of thin films. The substrate is shown as a silicon oxide (SiOx) substrate 400. The silicon oxide (SiOx) substrate 400 has a SiOx water contact angle 20° 430. The SiOx water contact angle 20° 430 creates a hydrophilic surface 435. The deposit of patterned carbon (C) dots 410 forms a two-dimensional pattern. The patterned carbon (C) dots 410 have a hydrophobic surface 420 relative to the silicon oxide (SiOx) substrate 400 of one embodiment.

PS-OH Self-Assembled Monolayer (SAM):

FIG. 4B shows for illustrative purposes only an example of a hydroxy terminated polystyrene self-assembled monolayer of one embodiment. FIG. 4B shows the patterned carbon (C) dots 410 directing the deposition of hydroxy terminated polystyrene (PS-OH) brush 440 to create a self-assembled monolayer (SAM). The SiOx water contact angle 20° 430 of FIG. 4A is a hydrophilic surface on which hydroxy terminated polystyrene (PS-OH) 440 spreads wetting the silicon oxide (SiOx) substrate 400. The hydroxy terminated polystyrene (PS-OH) brush 440 has a PS-OH on SiOx water contact angle 91° 445. The PS-OH on SiOx water contact angle 91° 445 is hydrophobic and spreads slowly. The patterned carbon (C) dots 410 block the wetting of the hydroxy terminated polystyrene (PS-OH) brush 440 self-assembled monolayer. The hydroxy terminated polystyrene (PS-OH) brush 440 self-assembled monolayer creates a hydrophobic 420 surface between the patterned carbon (C) dots 410 of one embodiment.

PS-PMMA Direct Self-Assembly:

FIG. 4C shows for illustrative purposes only an example of a PMMA block pinning using carbon thin film dots of one embodiment. FIG. 4C shows the silicon oxide substrate 400 with the patterned carbon (C) dots 410. A deposit of polystyrene-polymethyl methacrylate (PS-PMMA) is made on the hydrophobic surface of the hydroxy terminated polystyrene (PS-OH) brush 440 and the patterned carbon (C) dots 410. The deposit of polystyrene-polymethyl methacrylate (PS-PMMA) is a self-assembly directed by the patterned carbon (C) dots 410 of one embodiment.

The patterned carbon (C) dots 410 carbon thin film water contact angle 42° 475 directs the self-assembly of the polystyrene-polymethyl methacrylate (PS-PMMA). The C dot pins PMMA block 470 formation and separation of polymethyl methacrylate (PMMA) 460 from polystyrene (PS) 450. The PS and PMMA separation is aided by the barrier to the grafting of PMMA onto the substrate created by the hydroxy terminated polystyrene (PS-OH) brush 440 of one embodiment.

Figure 5A:
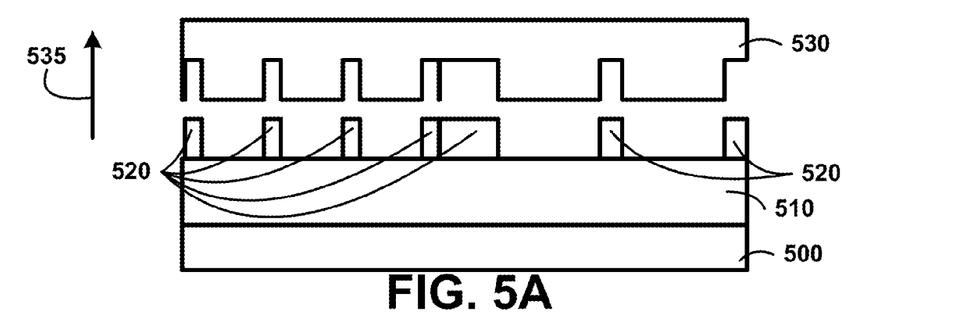
FIG. 5A shows for illustrative purposes only an example of a resist imprint of one embodiment.

Resist Imprint:

FIG. 5A shows for illustrative purposes only an example of a resist imprint of one embodiment. FIG. 5A shows a BPM resist imprint process that includes a template substrate 500 fabricated using materials including silicon oxide ($SiO_2$). A thin carbon layer 510 is deposited on the template substrate 500. A deposition of resist is made on the thin carbon layer 510. A quartz first density imprint template 530 is pressed into the resist deposition. The BPM resist imprint process proceeds to remove quartz first density imprint template 535 to create an imprinted resist 520 transferring the first density pattern. A process including ultra-violet (UV) light is used to cure the imprinted resist 520. The next step is described in FIG. 5B of one embodiment.

Figure 5B:
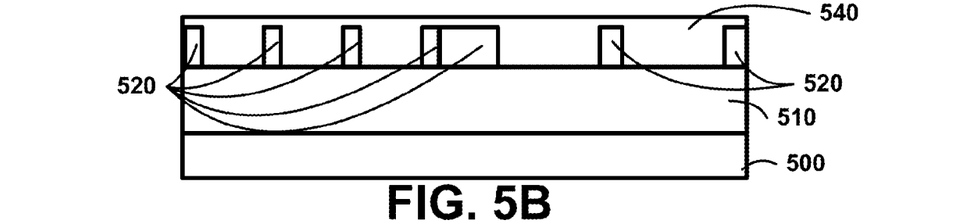
FIG. 5B shows for illustrative purposes only an example of spin coating of a HSQ resist layer of one embodiment.

Spin Coating of HSQ:

FIG. 5B shows for illustrative purposes only an example of spin coating of a HSQ resist layer of one embodiment. FIG. 5B shows the template substrate 500 including the thin carbon layer 510 and cured imprinted resist 520. Hydrogen silsesquioxane (HSQ) is a negative tone electron-beam resist. A spin coating layer of HSQ on top 540 of the imprinted resist 520 and thin carbon layer 510. The coating of HSQ is used in the formation of carbon dots and trenches. The continuing process is described in FIG. 5C of one embodiment.

Figure 5C:
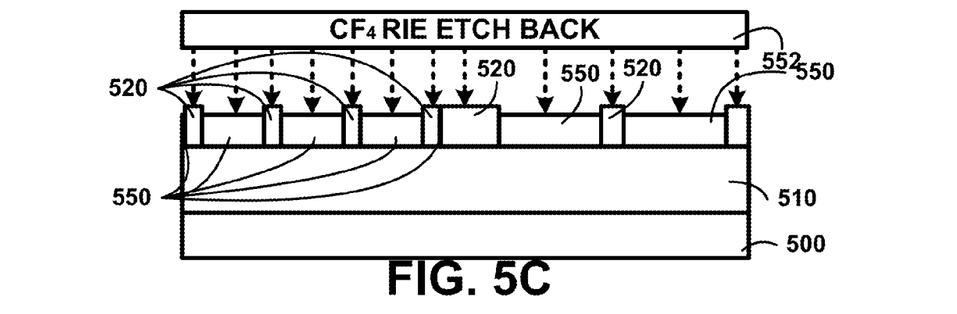
FIG. 5C shows for illustrative purposes only an example of an HSQ etch of one embodiment.

HSQ Etch:

FIG. 5C shows for illustrative purposes only an example of an HSQ etch of one embodiment. HSQ processing include using a process including reactive-ion etching (RIE) using a gas including tetrafluoromethane ($CF_4$) to react with the HSQ. FIG. 5C shows a $CF_4$ RIE etch back 552 process to etch the coating of HSQ to expose the imprinted resist 520. The $CF_4$ RIE etch back 552 process creates an etched HSQ 550 electron-beam resist on the thin carbon layer 510 deposited on the template substrate 500. The etched HSQ 550 electron-beam resist facilitates an electron-beam process described in FIG. 5D to transfer a negative of the cured resist pattern into the thin carbon layer 510 of one embodiment.

Figure 5D:
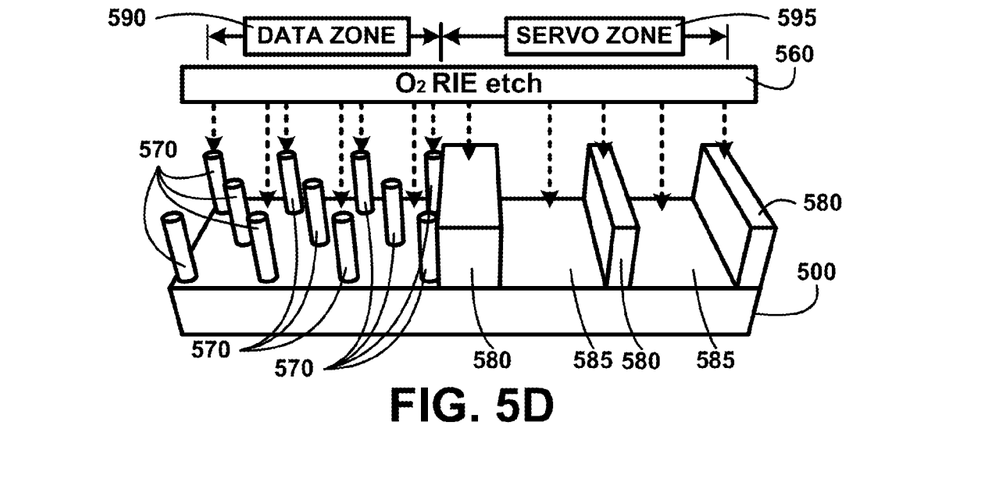
FIG. 5D shows for illustrative purposes only an example of etching a thin carbon layer of one embodiment.

Thin Carbon Layer Etch:

FIG. 5D shows for illustrative purposes only an example of etching a thin carbon layer of one embodiment. FIG. 5D shows the template substrate 500 with the etched thin carbon layer 510 of FIG. 5A. An $O_2$ RIE etch 562 process has removed the etched HSQ 550 of FIG. 5C and etched into the thin carbon layer 510 of FIG. 5A transferring a negative of the cured resist pattern. The remaining etched thin carbon layer 510 of FIG. 5A creates C-dots 570 and C-lines 580. The C-lines 580 create C-trench 585 areas of servo zone 595 regions. The C-dots 570 create first density patterns for example an areal density of 255 G dots per square inch (dpsi) in data zone 590 regions on the template substrate 500. FIG. 5D shows one embodiment of a first pattern and second pattern patterned thin film block copolymer direct self-assembly guiding structure prior to a process to trim of the C-dots 570 height. The next step is described in FIG. 6A of one embodiment.

Figure 6A:
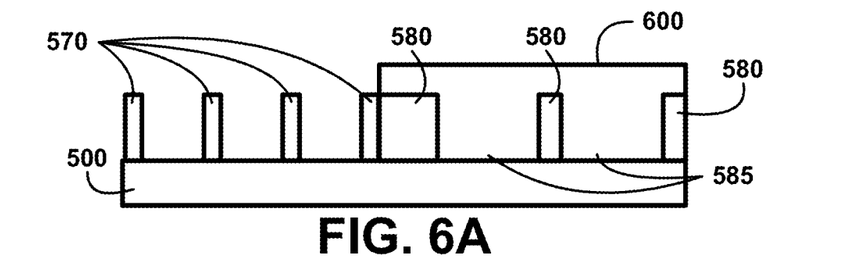
FIG. 6A shows for illustrative purposes only an example of optical lithography of one embodiment.

Optical Lithography:

FIG. 6A shows for illustrative purposes only an example of optical lithography of one embodiment. FIG. 6A shows the template substrate 500 and patterned thin carbon layer 510 of FIG. 5A. An optical resist 600 is applied over the C-lines 580 and C-trench 585 areas in the servo zone 595 of FIG. 5D regions. The optical resist 600 is used to protect the C-lines 580 and C-trench 585 during an optical lithography process. The C-dots 570 in the data zone 590 of FIG. 5D regions will be exposed to processing by optical lithography of one embodiment.

Figure 6B:
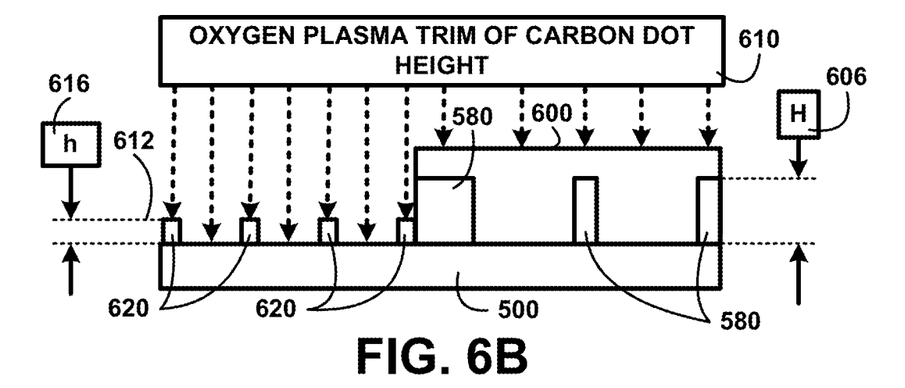
FIG. 6B shows for illustrative purposes only an example of an oxygen plasma trim of carbon dot height of one embodiment.

Oxygen Plasma Trim:

FIG. 6B shows for illustrative purposes only an example of an oxygen plasma trim of carbon dot height of one embodiment. FIG. 6B shows an optical lithography process using for example oxygen plasma. The optical lithography is an oxygen plasma trim of carbon dot height 610. An oxygen plasma trim depth 612 reduces the height of the C-dots 570 in the unprotected data zone 590 of FIG. 5D. The oxygen plasma trim of carbon dot height 610 trims the heights of the C-dots 570 to a dot height (h) equal to one third of a Lift-off (Lo) height. The $h_{dot}=\frac{1}{3}Lo$ 616 trimming creates trimmed carbon dots 620 of one embodiment.

The optical resist 600 protects the C-lines 580 from trimming of the C-lines 580 height (H) which is one and one-half the Lo height. The optical resist 600 also protects the C-trench 585 of FIG. 5D areas in the servo zone 595 of FIG. 5D regions. The trimmed carbon dots 620 with $h_{dot}=\frac{1}{3}Lo$ 616 and untrimmed C-lines 580 with $H_{trench}=1.5\,Lo$ 606 remain on the template substrate 500 of one embodiment.

Figure 6C:
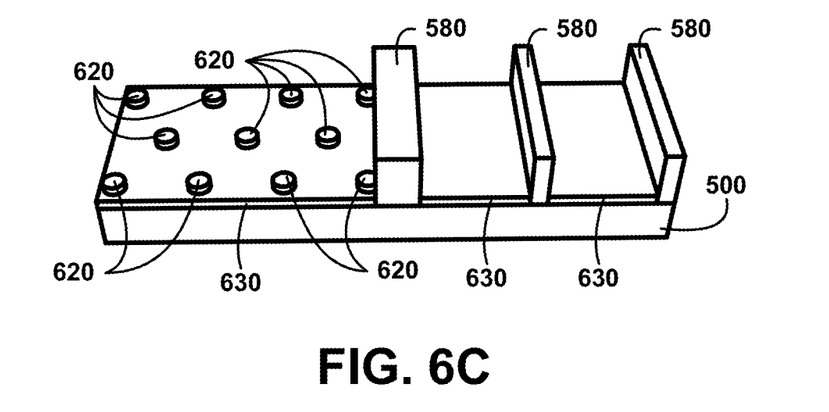
FIG. 6C shows for illustrative purposes only an example of a PS-OH graft on Si sites of one embodiment.

PS-OH Graft:

FIG. 6C shows for illustrative purposes only an example of a PS-OH graft on Si sites of one embodiment. FIG. 6C shows the trimmed carbon dots 620 and untrimmed C-lines 580 on the template substrate 500 after a process to strip away the optical resist 600 of FIG. 6A. FIG. 6C shows one embodiment of a first pattern and second pattern patterned thin film block copolymer direct self-assembly guiding structure after the oxygen plasma trim of carbon dot height 610 of FIG. 6B. The hydroxy terminated polystyrene (PS-OH) brush 440 of FIG. 4B is applied to the template substrate 500 to create a polystyrene (PS) self-assembled monolayer (SAM). The hydroxy terminated polystyrene (PS-OH) brush 440 of FIG. 4B SAM on for example the template substrate 500 using for example a silicon (Si) material creates a PS-OH graft onto the exposed Si sites of the template substrate 500. The PS-OH graft on the exposed Si sites creates a PS layer 630 surrounding the trimmed carbon dots 620. The PS layer 630 covers the C-trench 585 of FIG. 5D areas in the servo zone 595 of FIG. 5D regions between the C-lines 580 of one embodiment.

Figure 6D:
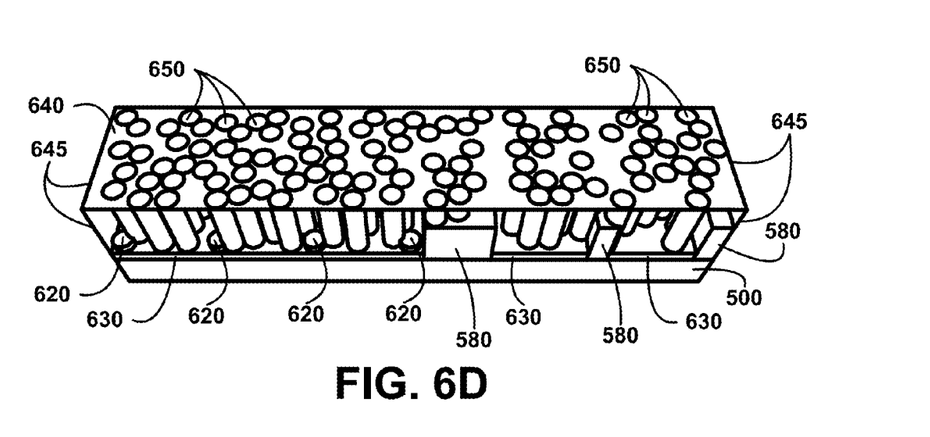
FIG. 6D shows for illustrative purposes only an example of a disordered coating of a block copolymer on patterned carbon films of one embodiment.

Disordered Coating of a Block Copolymer:

FIG. 6D shows for illustrative purposes only an example of a disordered coating of a block copolymer on patterned carbon films of one embodiment. FIG. 6D shows a disposition of a BCP 645 on the trimmed first pattern and second pattern patterned thin film block copolymer patterned carbon films guiding structures. A block copolymer (BCP) including sphere-forming block copolymers and cylinder-forming block copolymers is deposited on the trimmed carbon dots 620; C-lines 580 and PS layer 630 on the template substrate 500. The BCP coating on the patterned carbon films includes using for example polystyrene-polymethyl methacrylate (PS-PMMA). The polystyrene-polymethyl methacrylate (PS-PMMA) coating when deposited is disordered, wherein PS blocks 650 and PMMA blocks 640 are randomly distributed over the surface of one embodiment.

Figure 6E:
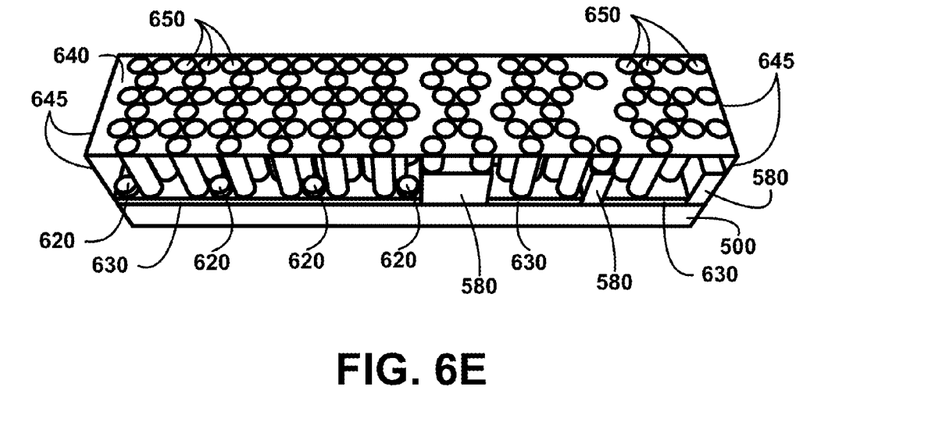
FIG. 6E shows for illustrative purposes only an example of an ordered block copolymer on patterned carbon films of one embodiment.

Ordered Block Copolymer:

FIG. 6E shows for illustrative purposes only an example of an ordered block copolymer on patterned carbon films of one embodiment. FIG. 6E shows ordering of the BCP using the C-lines 580 guide ordering of the BCP in the servo zones. The trimmed carbon dots 620 guide the ordering of the BCP in the data zones. The trimmed carbon dots 620 and C-lines 580 guide the ordering on the PS layer 630 on the template substrate 500 of one embodiment.

The disordered PS-PMMA is directed in the data zone 590 of FIG. 5D by the trimmed carbon dots 620 which pin the PMMA blocks 640 onto the trimmed carbon dots 620 surfaces. The PS blocks 650 attach to the PS layer 630 surrounding the trimmed carbon dots 620 in a second density pattern. The self-assembled PS-PMMA in the servo zone 595 of FIG. 5D regions is directed by the C-lines 580. The PS blocks 650 attach to the PS layer 630 covering the C-trench 585 of FIG. 5D areas created by the C-lines 580 in the servo zone 595 of FIG. 5D regions. The PS blocks 650 attach to the PS layer 630 are ordered into a second density pattern of one embodiment.

Figure 7A:
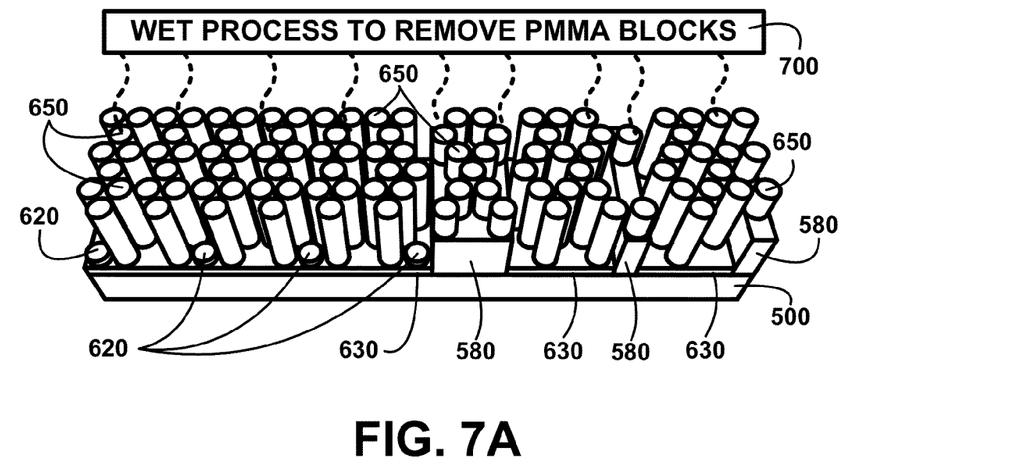
FIG. 7A shows for illustrative purposes only an example of a wet process removing one block from the ordered block copolymer of one embodiment.

PMMA Block Removal:

FIG. 7A shows for illustrative purposes only an example of a wet process removing one block from the ordered block copolymer of one embodiment. FIG. 7A shows the template substrate 500 including the trimmed carbon dots 620, C-lines 580 and PS layer 630. A wet process to remove PMMA blocks 700 is performed to remove the PMMA blocks 640 of FIG. 6D. The remaining portions of the BCP directed self-assembly on patterned carbon films are the second density for example an areal density greater than 1 Tera dots per square inch (Tdpsi) PS blocks 650 of one embodiment.

Figure 7B:
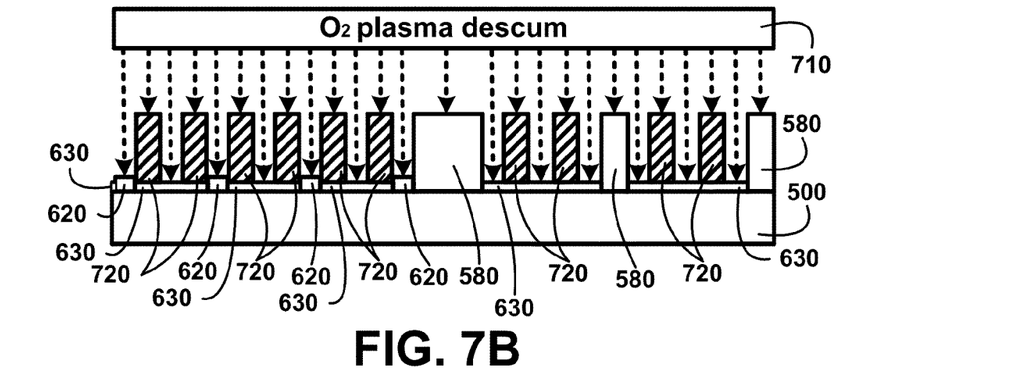
FIG. 7B shows for illustrative purposes only an example of processing PS blocks using an oxygen plasma descum and etch process of one embodiment.

Oxygen Plasma Descum:

FIG. 7B shows for illustrative purposes only an example of processing PS blocks using an oxygen plasma descum and etch process of one embodiment. FIG. 7B shows an $O_2$ plasma descum 710 process on the exposed PS layer 630, trimmed carbon dots 620 and C-lines 580 on the template substrate 500. The $O_2$ plasma descum 710 removes any residual PMMA material. The $O_2$ plasma descum 710 removes the PS blocks 650 of FIG. 6D on top of the C-lines 580. The $O_2$ plasma descum 710 etches the PS blocks 650 of FIG. 6D in the data zone and C-trench 585 of FIG. 5D areas of the servo zone 595 of FIG. 5D regions. The $O_2$ plasma descum 710 etch creates etched PS blocks 720 with a height equal to the height of the untrimmed C-lines 580 of one embodiment.

Figure 7C:
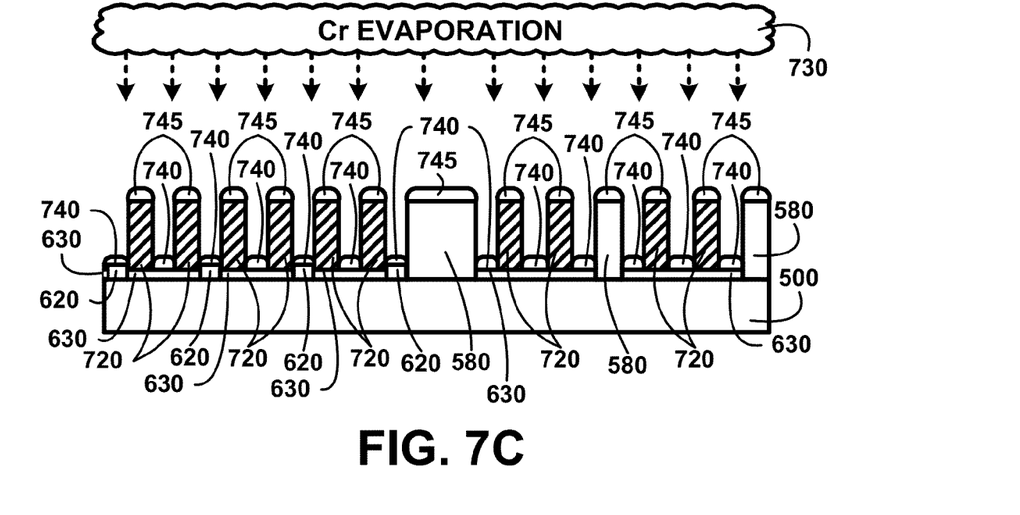
FIG. 7C shows for illustrative purposes only an example of a Cr hard mask layer of one embodiment.

Cr Hard Mask Layer:

FIG. 7C shows for illustrative purposes only an example of a Cr hard mask layer of one embodiment. FIG. 7C shows the template substrate 500, trimmed carbon dots 620, untrimmed C-lines 580, PS layer 630 and etched PS blocks 720. A process using Cr evaporation 730 creates a hard mask layer. A Cr hard mask 740 is deposited on the PS layer 630 and trimmed carbon dots 620. The Cr evaporation 730 deposition creates a capped Cr hard mask 745 on top of the etched PS blocks 720 and C-lines 580 of one embodiment.

Figure 8A:
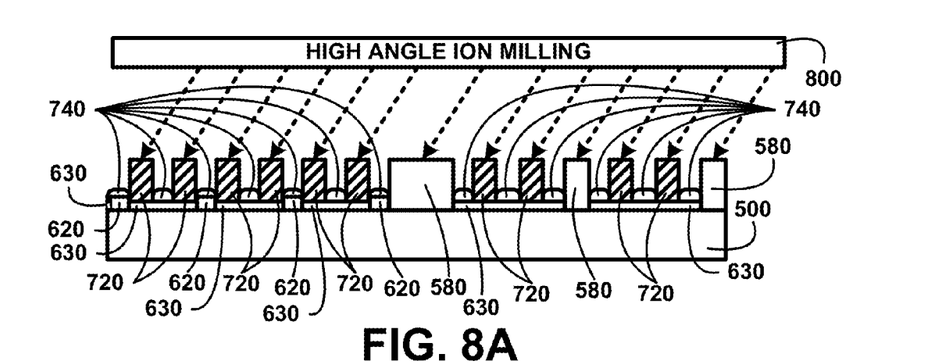
FIG. 8A shows for illustrative purposes only an example of high angle ion milling to remove capped Cr of one embodiment.

High Angle Ion Milling:

FIG. 8A shows for illustrative purposes only an example of high angle ion milling to remove capped Cr of one embodiment. FIG. 8A shows the Cr hard mask 740 on the trimmed carbon dots 620 and PS layer 630 on the template substrate 500. The capped Cr hard mask 745 of FIG. 7C on the etched PS blocks 720 and C-lines 580 is removed using a high angle ion milling 800. The high angle ion milling 800 removes a portion of the etched PS blocks 720 and C-lines 580 reducing their height of one embodiment.

Figure 8B:
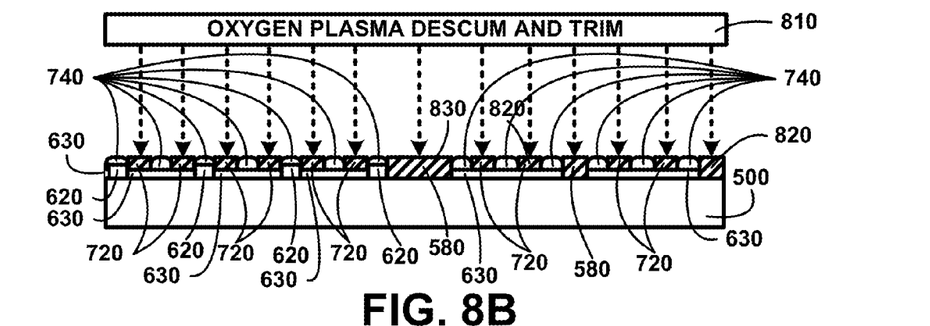
FIG. 8B shows for illustrative purposes only an example of a descum and trim process using an oxygen plasma of one embodiment.

Oxygen Plasma Descum and Trim:

FIG. 8B shows for illustrative purposes only an example of a descum and trim process using an oxygen plasma of one embodiment. FIG. 8B shows the template substrate 500 with the PS layer 630 and trimmed carbon dots 620 topped using the Cr hard mask 740. Oxygen plasma descum and trim 810 is used to clean the surfaces. The etched PS blocks 720 of FIG. 7B and the C-lines 580 of FIG. 5D with reduced heights are trimmed further using the oxygen plasma descum and trim 810 processes. Trimmed PS blocks 820 and trimmed C-lines 830 match the height of the Cr hard mask 740 of one embodiment.

Figure 8C:
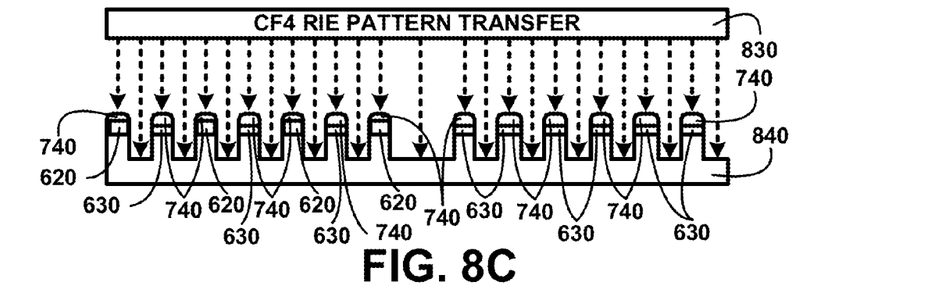
FIG. 8C shows for illustrative purposes only an example of transferring the pattern from the remaining block of the block copolymer to the substrate of one embodiment.

Pattern Transfer:

FIG. 8C shows for illustrative purposes only an example of transferring the pattern from the remaining block of the block copolymer to the substrate of one embodiment. FIG. 8C shows for example a $CF_4$ RIE pattern transfer 830 process used to etch the template substrate 500 of FIG. 5A. The Cr hard mask 740 layer is used to mask portions of the template substrate 500 of FIG. 5A from the $CF_4$ RIE etch. Beneath the Cr hard mask 740 layer are the trimmed carbon dots 620 and portions of the PS layer 630 also masked from the etching process. The $CF_4$ RIE pattern transfer 830 process removes the trimmed PS blocks 820, trimmed C-lines 830 and unmasked portions of the PS layer 630. The processed pattern is etched into the template substrate 500 of FIG. 5A using the $CF_4$ RIE pattern transfer 830 process to create an etched template substrate 840 of one embodiment.

Figure 8D:
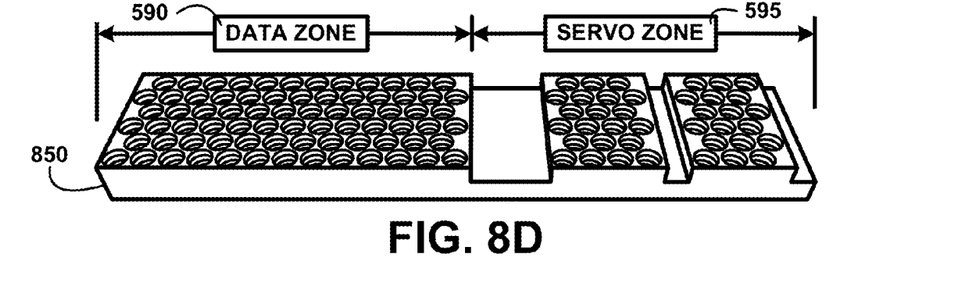
FIG. 8D shows for illustrative purposes only an example of a fabrication pattern patterned template using patterned thin films of one embodiment.

Fabrication Pattern Patterned Template:

FIG. 8D shows for illustrative purposes only an example of a fabrication pattern patterned template using patterned thin films of one embodiment. Processes including high angle ion milling 800 of FIG. 8A are used to remove the Cr hard mask 740 of FIG. 7C. A process including an oxygen plasma descum and trim 810 of FIG. 8A is used to remove the trimmed carbon dots 620 and portions of the PS layer 630 and any residual materials on the etched template substrate 840 of FIG. 8C. The removal, descum and trimming processes reveal a high areal density BPM template 850 with high areal density dots for example greater than 1 Tdpsi in the data zone 590 and high areal density dots for example greater than 1 Tdpsi in the servo zone 595 created using the block copolymer assembly of one embodiment.

The foregoing has described the principles, embodiments and modes of operation. However, the invention should not be construed as being limited to the particular embodiments discussed. The above described embodiments should be regarded as illustrative rather than restrictive, and it should be appreciated that variations may be made in those embodiments by workers skilled in the art without departing from the scope as defined by the following claims.

What is claimed is:

1. A block copolymer assembly, comprising:
a first pattern having a first density with multi-dimensional features transferred into data zones of thin film layers that are deposited onto a silicon substrate;
a second pattern of one-dimensional features transferred into servo zones of the thin film layers and configured to be integrated with the data zone; and
a fabrication pattern with a second density greater than the first density, wherein the fabrication pattern is of ordered block copolymer periodic structures configured to be located across a portion of the silicon substrate.

2. The block copolymer assembly of claim 1, wherein the first pattern and second pattern depositions of thin film layers includes depositions of carbon (C), titanium (Ti), chromium (Cr), imprint resist and other film materials.

3. The block copolymer assembly of claim 1, wherein the fabrication pattern is created using the features of the data zones and the servo zones and directs phase separation of a disordered coating of block copolymer that is deposited onto the silicon substrate and wherein the fabrication pattern is transferred into the substrate material including silicon or glass and across an entire portion of the substrate below the thin film layers using an etching process to create templates.

4. The block copolymer assembly of claim 1, wherein the first pattern first density multi-dimensional features includes guiding structures including an areal density of 255 Giga dots per square inch (Gdpsi).

5. The block copolymer assembly of claim 1, wherein the second pattern one-dimensional features includes one-dimensional thin film lines.

6. The block copolymer assembly of claim 1, wherein the second density of the fabrication pattern of ordered block copolymer periodic structures includes an areal density greater than 1 Tera dots per square inch (Tdpsi).

7. The block copolymer assembly of claim 3, wherein the templates are for use in the fabrication of semiconductor, photonic devices and second density stacks including high areal density servo-integrated bit patterned media.

8. The block copolymer assembly of claim 3, wherein the fabrication processes using the templates include a dry lift-off pattern transfer process to transfer the template pattern into a stack.

9. The block copolymer assembly of claim 1, wherein the disordered coating of a block copolymer includes poly (styrene-block-methyl methacrylate) P(S-b-MMA), polystyrene-polyethylene oxide (PS-PEO), poly(styrene-dimethyl siloxane) (PS-PDMS), sphere-forming block copolymers and cylinder-forming block copolymers.

10. A block copolymer assembly structure, comprising:
a first pattern and second pattern with a first density of patterned features integrated in data and servo zones;
a silicon substrate with thin film layers deposited thereon and patterned using the first density of first pattern and second pattern features; and
a template fabrication pattern with a second density greater than the first density created using ordered block copolymer periodic structures across a portion of the substrate.

11. The block copolymer assembly structure of claim 10, wherein the first pattern and second pattern thin film layers include carbon (C), titanium (Ti), chromium (Cr), imprint resist and other film materials.

12. The block copolymer assembly structure of claim 10, wherein the first pattern first density of patterned features includes guiding structures and second pattern one-dimensional thin film lines.

13. The block copolymer assembly structure of claim 10, wherein the first pattern and second pattern features direct phase separation across a portion of the substrate of a disordered coating of block copolymer that is deposited onto the silicon substrate, wherein the disordered coating of block copolymer includes poly(styrene-block-methyl methacrylate) P(S-b-MMA), polystyrene-polyethylene oxide (PS-PEO), poly(styrene-dimethyl siloxane) (PS-PDMS), sphere-forming block copolymers and cylinder-forming block copolymers.

14. The block copolymer assembly structure of claim 10, wherein the second density template fabrication pattern is etched down to the entire substrate material including silicon or glass and across the entire substrate below the thin film layers to create a template.

15. An assembly comprising:
a substrate comprising a layer on a surface;
a first pattern comprising a plurality of guiding structures formed on the layer;
a second pattern comprising a plurality of lines formed on the layer; and
a fabrication pattern comprising ordered block copolymer structures defined by the dots of the first pattern and the lines of the second pattern.

16. The assembly of claim 15, wherein the guiding structures have a first height and the lines have a second height, and wherein the first height is less than the second height.

17. The assembly of claim 15, wherein the layer comprises carbon (C).

18. The assembly of claim 15, wherein the block copolymer structures comprise a plurality of polystyrene (PS) structures.

19. The assembly of claim 15, further comprising a plurality of trenches defined by a pair of adjacent lines.

20. The assembly of claim 15, further comprising a hydroxyl terminated polystyrene (PS-OH) graft on a plurality of exposed portions of the surface of the substrate.

* * * * *